US011417453B2

United States Patent
Bibes et al.

(10) Patent No.: US 11,417,453 B2
(45) Date of Patent: Aug. 16, 2022

(54) ELECTRONIC DEVICE, DIGITAL PORT, ANALOG COMPONENT, AND METHOD FOR GENERATING A VOLTAGE

(71) Applicants: THALES, Courbevoie (FR); CENTRE NATIONAL DE LA RECHERCHE SCIENTIFIQUE, Paris (FR); COMMISSARIAT À L'ÉNERGIE ATOMIQUE ET AUX ÉNERGIES ALTERNATIVES, Paris (FR)

(72) Inventors: Manuel Bibes, Palaiseau (FR); Laurent Vila, Grenoble (FR); Jean-Philippe Attané, Grenoble (FR); Paul Noël, Grenoble (FR); Diogo Castro Vaz, Palaiseau (FR)

(73) Assignees: THALES, Courbevoie (FR); CENTRE NATIONAL DE LA RECHERCHE SCIENTIFIQUE, Paris (FR); COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 0 days.

(21) Appl. No.: 17/418,667

(22) PCT Filed: Dec. 27, 2019

(86) PCT No.: PCT/EP2019/087111
§ 371 (c)(1),
(2) Date: Jun. 25, 2021

(87) PCT Pub. No.: WO2020/136267
PCT Pub. Date: Jul. 2, 2020

(65) Prior Publication Data
US 2022/0076868 A1    Mar. 10, 2022

(30) Foreign Application Priority Data
Dec. 28, 2018  (FR) ...................................... 1874319

(51) Int. Cl.
*H01L 29/66*    (2006.01)
*H01F 10/32*    (2006.01)
*H03K 17/56*    (2006.01)

(52) U.S. Cl.
CPC ........... *H01F 10/324* (2013.01); *H03K 17/56* (2013.01)

(58) Field of Classification Search
CPC ............... H01F 10/3254; H01F 10/329; H01F 10/3286; H01F 10/3272; H01L 43/10;
(Continued)

(56) References Cited

U.S. PATENT DOCUMENTS

| 2017/0243917 A1 | 8/2017 | Manipatruni et al. |
| 2018/0240896 A1 | 8/2018 | Nikonov et al. |

(Continued)

FOREIGN PATENT DOCUMENTS

| WO | WO 2017214628 A1 | 12/2017 |
| WO | WO 2018182694 A1 | 10/2018 |

OTHER PUBLICATIONS

Towards a ferroelectric control of Rashba spin-orbit coupling: BI on BatiO3(001) from first principles: Physical Review B, vol. 81, No. 7, Feb. 22, 2010, pp. 073406-1-073406-4, XP055640570, US ISSN: 1098-0121, DOI: 10.113/PhysRevB.81.073406 *abrege, tableau I*.
(Continued)

*Primary Examiner* — Quan Tra
(74) *Attorney, Agent, or Firm* — ArentFox Schiff LLP

(57) ABSTRACT

The present invention relates to an electronic device including an input and an output, the device generating an output voltage when the input of the device is supplied, the device comprising:
a conversion unit converting a spin current into a charge current having an amplitude and a sign,
a spin current application unit applying a spin current to the conversion unit, (Continued)

Figure 1:
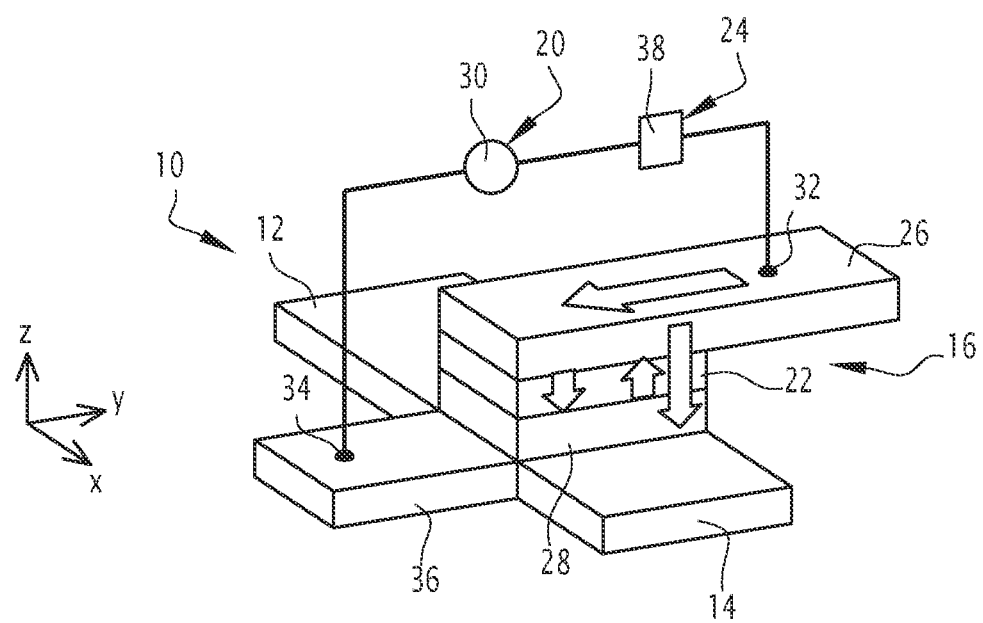

a ferroelectric layer, which has a ferroelectric polarization and is arranged such that the ferroelectric polarization controls at least one among the amplitude and the sign of the charge current, and an electric field application unit suitable for applying an electric field to the ferroelectric layer to control the ferroelectric polarization.

14 Claims, 4 Drawing Sheets

(58) Field of Classification Search
CPC ......... H01L 27/22; H01L 43/02; H01L 43/08; H03K 19/17728; H03K 19/18
USPC .......................................................... 257/565
See application file for complete search history.

(56) References Cited

U.S. PATENT DOCUMENTS

| | | | |
|---|---|---|---|
| 2018/0240964 A1* | 8/2018 | Nikonov | H01L 43/08 |
| 2018/0358542 A1 | 12/2018 | Mihajlovic et al. | |
| 2019/0386662 A1* | 12/2019 | Lin | H01F 10/329 |
| 2020/0365652 A1* | 11/2020 | Hong | H03K 19/18 |

OTHER PUBLICATIONS

"Spin-Orbit Logic with Magnetoelectric Switching a Multi-Generation Scalable Change Mediated Nonvolatile Spintronic logic", arXiv:1512.05428, Dec. 17, 2015, pp. 1-60, XP055559479, Extrait de l'internet: URL:https://arxiv.org/ftp/arvix/papers/1512/1512.05428.pdf.

* cited by examiner

ELECTRONIC DEVICE, DIGITAL PORT, ANALOG COMPONENT, AND METHOD FOR GENERATING A VOLTAGE

CROSS-REFERENCE TO RELATED APPLICATIONS

This application is a National Stage Entry of International Patent Application No. PCT/EP2019/087111, filed on Dec. 27, 2019, which claims priority to French Application No. 18 74319, filed on Dec. 28, 2018. The disclosures of the priority applications are incorporated in their entirety herein by reference.

The present invention relates to an electronic device. The invention also relates to a digital port or an analog component including such a device as well as to a method for generating a voltage.

Microprocessors, like many electronic devices, are made up of transistors using CMOS technology. The acronym CMOS comes from the term Complementary Metal Oxide Semiconductor and designates a technology for manufacturing electronic devices.

During operation, the current passing through the transistor is modulated based on the voltage applied on an electrode usually called a gate. More specifically, depending on this voltage, charges are accumulated or depleted in a channel whose conductivity is thus modulated. In practice, such operation involves several sources of energy losses which are added together: unwanted current in the channel in the off state, loss by establishment of stray current between the channel and the gate or loss at the gate.

Now, in the field of microelectronics, it has been observed that according to Moore's law, the number of transistors per unit of surface in integrated circuits is continuing to increase exponentially.

This causes an increase in the dissipated power per unit of surface, which, in turn, increases the electrical consumption of the integrated circuit.

Furthermore, in microprocessors, the storage unit and the computing units are spatially separated, and the energy cost related to the movements of information between the two units is much greater than the cost related to the computation itself.

Microprocessors therefore consume large amounts of electrical energy. This high electrical consumption limits the performance of microprocessors.

There is a need for an electronic device, in particular a transistor, able to generate an output voltage which has a reduced consumption.

To do this, proposed is an electronic device including an input and an output, the device generating an output voltage when the input of the device is supplied, the device comprising a conversion unit converting a spin current into a charge current, the charge current having an amplitude and a sign. The device also includes a spin current application unit applying a spin current to the conversion unit, a layer made from a ferroelectric material, called ferroelectric layer, which has a ferroelectric polarization, the ferroelectric layer being arranged such that the ferroelectric polarization controls at least one among the amplitude and the sign of the charge current converted by the conversion unit. The device also includes an electric field application unit applying an electric field to the ferroelectric layer to control the ferroelectric polarization of the ferroelectric layer.

Such a device operates by controlling the polarization of a ferroelectric layer. Controlling such a polarization makes it possible to control the charge current induced by the conversion unit.

This operation is different from an operation present in the state of the art, in which the current is controlled by controlling the magnetization of a ferromagnetic layer, and more specifically the intensity of magnetization. In such a case, it is possible to use a ferroelectric layer for its piezoelectric effects making it possible to act on the magnetization of the ferromagnetic layer. Such an operation does not use the polarization of the ferroelectric layer at all.

Furthermore, the reversal of the magnetization by applying a magnetic field or a strong current consumes very large amounts of energy. Thus, at an equal volume, the energy necessary to reverse the polarization of a ferroelectric layer is typically 1000 times lower than that necessary to reverse a magnetization; the device makes it possible to perform logic operations with a very low energy expenditure. In other words, this operation, different from the state of the art, makes it possible to generate an output voltage while decreasing the consumption of the device.

According to specific embodiments, the electronic device comprises one or more of the following features, considered alone or according to any technically possible combinations:
- the conversion unit includes the ferroelectric layer and a layer having a strong spin-orbit coupling, a spin-orbit coupling being strong when the spin-orbit coupling is greater than or equal to 1 meV, the ferroelectric layer and the layer having a strong spin-orbit coupling being in contact.
- the layer having a strong spin-orbit coupling is a layer made from a heavy material, a heavy material being a material whose atomic number is greater than or equal to 15.
- the layer having a strong spin-orbit coupling is a layer made from a heavy metal, a heavy metal being a metal whose atomic number is greater than or equal to 15.
- the spin current application unit includes first terminals and the electric field application unit includes second terminals, the first terminals and the second terminals being combined.
- the device includes a dielectric layer, the dielectric layer resting on a part of the input, the conversion unit resting on a part of the output, the ferroelectric layer being arranged to establish a contact between the dielectric layer and the conversion unit.
- the conversion unit and the ferroelectric layer are topped by a ferromagnetic layer.
- the conversion unit is adapted to convert a spin current into a charge current according to a physical phenomenon, the physical phenomenon being an inverse Rashba-Edelstein effect or an inverse spin Hall effect.
- the device is a transistor.

Furthermore, the present description also relates to a digital port, in particular belonging to a storage unit, including at least one device as previously described.

The present description also proposes an analog component, in particular belonging to a neural network, comprising at least one device as previously described.

The present description also describes a method for generating an output voltage by an electronic device, in particular a transistor, the device including an input and an output, the device generating an output voltage when the input of the device is supplied, the device comprising a conversion unit, a spin current application unit, a layer made from a ferroelectric material, called ferroelectric layer, having a ferroelectric polarization, the ferroelectric layer being arranged so that the ferroelectric polarization controls at least one among the amplitude and the sign of the charge current, and an electric field application unit. The method comprises a step of applying a spin current to the conversion unit, the step of applying a spin current being carried out by the spin current application unit. The method also comprises a step for conversion by the spin current conversion unit applied to a charge current, the charge current having an amplitude and a sign, and a step for applying an electric field to the ferroelectric layer, the step for applying an electric field being carried out by the electric field application unit.

Figure 2:
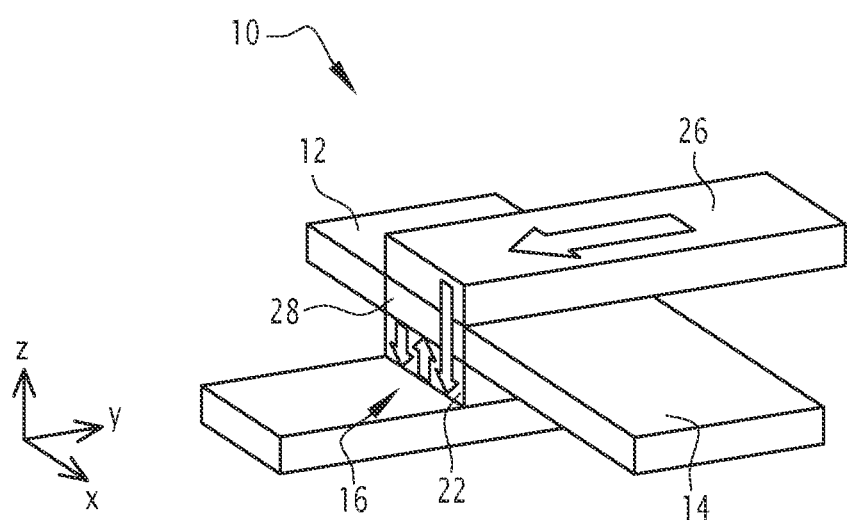
Figure 3:
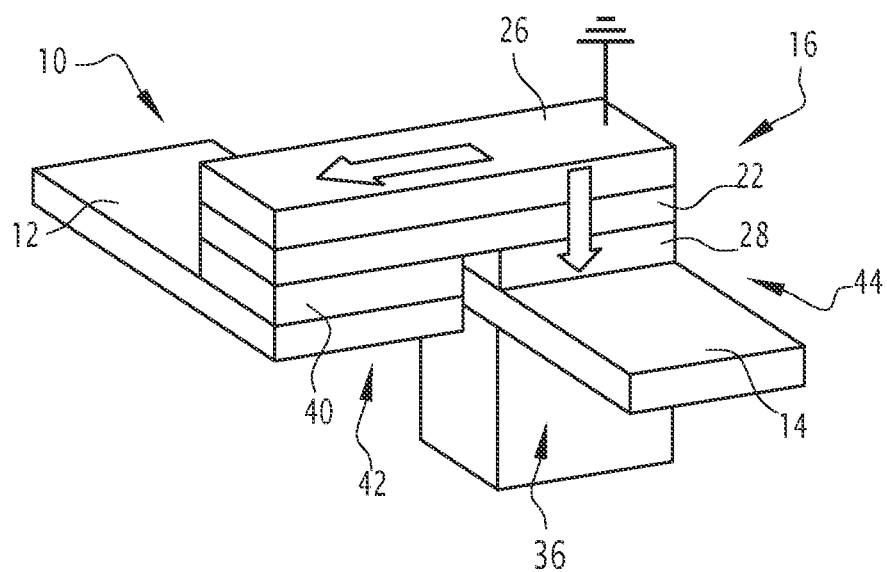
Figure 4:
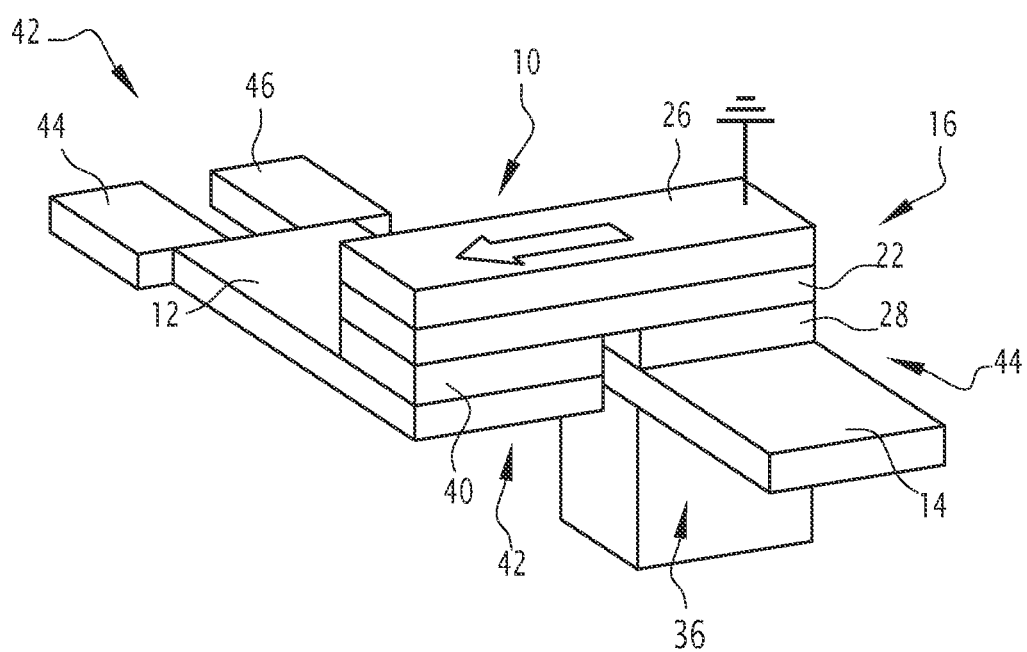

Other features and advantages of the invention will appear upon reading the following description of embodiments of the invention, provided as an example only and in reference to the drawings, which are:

FIG. 1, a schematic perspective view of an example electronic device,

FIG. 2, a schematic perspective view of another example electronic device,

FIG. 3, a schematic perspective view of still another example electronic device, and FIG. 4, a schematic perspective view of an example logic gate.

An electronic device 10 is shown schematically in FIG. 1.

The device 10 includes an input 12 and an output 14.

The input 12 and the output 14 are shown in FIG. 1 in the form of conductive track portions.

The device 10 is adapted to generate a voltage on the output 14 when the device 10 is electrically supplied at the input 12.

According to the proposed example, the device 10 is a transistor, that is to say, a device adapted to amplify an electric signal in a controlled manner.

The device 10 includes a conversion unit 16, a spin current application unit 20, a layer made from a ferroelectric material 22, called ferroelectric layer 22, an electric field application unit 24 and a ferromagnetic layer 26.

The conversion unit 16 is adapted to convert a spin current into a charge current.

The charge current thus converted has an amplitude and a sign.

As will be explained later, the conversion unit 16 of FIG. 1 is adapted to convert a spin current into a charge current according to an inverse Rashba-Edelstein effect.

The conversion unit 16 includes the ferroelectric layer 22 and a layer having a strong spin-orbit coupling 28.

The layer having a strong spin-orbit coupling is called SOC layer 28 hereinafter, the acronym SOC referring to the term "Spin-Orbit Coupling."

The spin-orbit coupling is strong when the spin-orbit coupling is greater than or equal to 1 meV.

According to the illustrated example, the SOC layer 28 is a layer made from a heavy material.

A heavy material is a material whose atomic number is greater than or equal to 15.

In a variant, the SOC layer 28 is made from an alloy or a compound comprising a heavy metal.

A heavy material is a metal whose atomic number is greater than or equal to 15, such as Au, Pt, W or Ir, for example.

The ferroelectric layer 22 and the SOC layer 28 are in contact so as to form a stack in a stacking direction Z.

Hereinafter, a first transverse direction X and a second transverse direction Y are also defined, each perpendicular to the stacking direction Z and perpendicular to one another.

The spin current application unit 20 is adapted to apply a spin current to the conversion unit 16.

In the proposed example, the spin current application unit 20 includes a spin current generator 30 and two terminals 32 and 34.

The spin current generator 30 is adapted to establish a spin current between the two terminals 32 and 34.

The first terminal 32 is a contact done in the ferromagnetic layer 26.

The second terminal 34 is a contact done in the third track portion 36.

For each of the track portions, a main extension direction is defined.

The main extension direction of the first track portion 12 corresponding to the input is the same as that of the second track portion 14 corresponding to the output. In the case of FIG. 1, this main extension direction is the first transverse direction X.

The third track portion 36 is oriented along a main extension direction which is perpendicular to the main extension direction of the input 12 and the output 14, that is to say, along the second transverse direction Y.

The third track portion 36 is in contact with the SOC layer 28.

The ferroelectric layer 22 has a ferroelectric polarization.

For example, the ferroelectric layer 22 is made from $BaTiO_3$, $PbZrO_3$, $PbTiO_3$, $BiFeO_3$, $HfO_2$, $ZrO_2$ or Polyvinylidene Fluoride (PVDF).

The ferroelectric polarization is the order parameter of the ferroelectric material from which the ferroelectric layer 22 is made.

The ferroelectric layer 22 is arranged such that the ferroelectric polarization controls at least one among the amplitude and the sign of the charge current converted by the conversion unit 16.

In the case at hand, the ferroelectric layer 22 is superimposed with the SOC layer 28.

The electric field application unit 24 is adapted to apply an electric field on the ferroelectric layer 22.

The applied electric field makes it possible to control the ferroelectric polarization of the ferroelectric layer 22.

According to the example of FIG. 1, the electric field application unit 24 includes an electric field generator 38 and terminals combined with the terminals 32 and 34 of the spin current application unit 20.

The ferromagnetic layer 26 tops the conversion unit 16 and is more specifically positioned above the ferroelectric layer 22.

According to a first example, the material used for the ferromagnetic layer 26 is a metal such as Co, Fe or Ni.

In a second example, the material of the ferromagnetic layer 26 is an alloy of Co, Fe or Ni. In particular, the materials NiFe or CoFe are used.

In a variant, other alloys are considered to form the ferromagnetic layer 26, such as CoFeB or NiMnSb.

The operation of the device 10 is now described in reference to one example embodiment of a method for generating an output voltage by the device 10.

The generating method includes several steps, which are described briefly hereinafter.

The magnetization of the ferromagnetic layer 26 is kept fixed along a direction, called magnetization direction.

During the application step, the spin current application unit 20 applies a spin-polarized current between the ferromagnetic layer 26 and the third track portion 36. The spin direction is parallel to the magnetization direction.

The spin current then propagates toward the SOC layer 28 along the stacking direction Z.

During a conversion step, the spin current which has propagated toward the SOC layer 28 arrives at the interface between the SOC layer 28 and the ferroelectric layer 22.

As previously indicated, by inverse Rashba-Edelstein effect, the spin current is converted into electric current.

The inverse Rashba-Edelstein effect results from the combination of two simultaneous phenomena, which are the inverse Edelstein effect and the Rashba effect.

The inverse Edelstein effect allows a spin current to be converted into a charge current on the surface of a topological insulator or at an interface having a Rashba effect.

The Rashba effect appears on the surface of a material or at the interface between two materials where the inversion symmetry is broken, which results in the appearance of an electrical field perpendicular to the surface or to the interface.

In the case of the device 10 of FIG. 1, the conversion unit 16 with the interface between the SOC layer 28 and the ferroelectric layer 22 constitutes the system having the Rashba effect.

In the presence of a Rashba effect, the wave vector of the electrons and the spin are coupled; the spin degeneracy is lifted and in the simplest case, the electronic structure of the surface or of the interface consists of two concentric Fermi contours having opposite spin chiralities.

When a spin current is injected into the conversion unit 16, the inverse Edelstein effect causes an opposite but non-equivalent shift of the Fermi contours to occur, which generates a charge current.

According to a variant, the spin/charge conversion can also be done by using the inverse spin Hall effect.

Simultaneously with this step for conversion into a charge current, the electric field application unit 24 applies an electric field to the ferroelectric layer 22. The applied electric field makes it possible to modify the ferroelectric polarization.

Along the polarization direction, the Rashba state at the SOC layer 28 and ferroelectric layer 22 interface is modified and the charge current generated by the conversion unit 16 via the inverse Edelstein effect is modulated in amplitude and/or sign.

The polarization state of the ferroelectric layer 22 therefore makes it possible to control the output voltage of the device 10.

In this sense, the device 10 makes it possible to store information, the information being encoded by the state of the ferroelectric polarization.

The device 10 is reconfigurable, since the configuration is controlled by the electric field application unit 24.

Relative to other spintronic devices, the reversal of the magnetization by applying a magnetic field or a strong current is avoided, which is very energy-consuming, in favor of controlling the interconversion of spin currents into charge currents by controlling the reversal of the ferroelectric polarization by applying an electric field. Additionally, ferroelectric materials house and can generate strong electric fields at the interface with a material.

Thus, in other words, spin currents can also be generated, manipulated and converted through electric voltages and in a nonvolatile manner, without using the very energy-consuming reversal of the magnetization of ferromagnetic materials.

Furthermore, controlling the ferroelectric polarization yields better results than controlling the magnetization of a material, in particular in terms of reversibility, reproducibility or endurance (up to $10^{15}$ cycles compared to around ten).

Synthetically, the device 10 is thus a bipolar transistor, is nonvolatile and consumes little energy.

Another example device 10 is illustrated in FIG. 2.

The device according to FIG. 2 is described in terms of how it differs from the device of FIG. 1.

In particular, the remarks relating to the device of FIG. 1 which are valid for the device of FIG. 2 are not repeated. Additionally, to simplify FIG. 2, the application units 20 and 24 are not shown.

In the case of FIG. 2, the positions of the SOC layer 28 and of the ferroelectric layer 22 are reversed.

Thus, the SOC layer 28 is interposed between the ferromagnetic layer 26 and the ferroelectric layer 22.

The operation and the advantages procured by the device 10 according to FIG. 2 are identical to the case of the device 10 of FIG. 1.

Another example device 10 is illustrated in FIG. 3.

The device 10 according to FIG. 3 is described in terms of how it differs from the device of FIG. 1. Therefore, the remarks which are valid for the devices of FIGS. 1 and 2 are not reiterated hereinafter.

According to the example of FIG. 3, the device 10 further includes a dielectric layer 40.

The dielectric layer 40 rests on part of the input 12 and the SOC layer 28 rests on part of the output 14.

The ferroelectric layer 22 is arranged to establish a contact between the dielectric layer 40 and the conversion unit 16.

More specifically, the ferroelectric layer 22 is positioned above the dielectric layer 40 and the SOC layer 28, in contact with both layers 28 and 40.

The device 10 thus includes two arms 42 and 44 connected to one another, the first arm 42 being formed by the dielectric layer 40 and the ferroelectric layer 22 and the second arm 44 being formed by the conversion unit 16 (SOC layer 28 and ferroelectric layer 22).

The two arms 42 and 44 are aligned along the second transverse direction Y, such that the main extension directions of the input 12 and the output 14 are not aligned as is the case in the devices 10 of FIGS. 1 and 2, but offset along the second transverse direction Y.

The ferromagnetic layer 26 is in contact with the ferroelectric layer 22.

As shown in FIG. 3, the ferromagnetic layer 26 is grounded.

A spin current is thus generated in the stack in the second arm 44 using the element with reference sign 36 in FIG. 3.

During operation, the application of a current on the input 12 charges the first arm 42, which acts as a capacitive element.

Therefore, when the threshold voltage of the capacitive element is reached, the polarization of the part of the ferroelectric layer is reversed.

The reversal of the polarization moves into the ferroelectric layer 22 by domain wall displacement.

The polarization reversal thus makes it possible to control the amplitude or the direction of the charge current that the conversion unit 16 converts from the spin current which is applied to the conversion unit 16.

In the case of this device 10, the reversal of the ferroelectric polarization is done at a very low energy cost due to the strong resistance of the left arm (dielectric layer and ferroelectric layer assembly).

The device 10 shown in FIG. 3 further has the advantage of being concatenable, that is to say, the output voltage of a given device 10 can be used as input voltage of a following device 10.

Such a device 10 is usable for many applications.

For example, as illustrated in FIG. 4, the device 10 is part of a digital port 42, which digital port is in turn part of a storage unit.

In this case, the input 12 includes two insertion terminals 44 and 46 such that the digital port 42 performs a logic operation from values inserted on the two insertion terminals 44 and 46.

The obtained logic operation can be done based on the manner in which the input currents injected on the two insertion terminals 44 and 46 act on the ferroelectric polarization and the correspondence between the direction of the polarization and the sign of the current generated at the output.

The digital port 42 is reconfigurable and makes it possible to perform logic operations of the "or" or "and" type with a low consumption.

According to another example, the device 10 includes an analog component. The analog component is part of a neural network.

Here again, using the device 10 makes it possible to reduce the electrical consumption.

The invention claimed is:

1. Electronic device including an input and an output, the device generating an output voltage when the input of the device is supplied, the device comprising:
   a conversion unit adapted to convert a spin current into a charge current, the charge current having an amplitude and a sign,
   a spin current application unit adapted to apply a spin current to the conversion unit,
   a layer made from a ferroelectric material, called ferroelectric layer having a ferroelectric polarization, the ferroelectric layer being arranged such that the ferroelectric polarization controls at least one among the amplitude and the sign of the charge current converted by the conversion unit, and
   an electric field application unit adapted to apply an electric field to the ferroelectric layer to control the ferroelectric polarization of the ferroelectric layer.

2. Device according to claim 1, wherein the conversion unit includes the ferroelectric layer and a layer having a strong spin-orbit coupling, a spin-orbit coupling being strong when the spin-orbit coupling is greater than or equal to 1 meV, the ferroelectric layer and the layer having a strong spin-orbit coupling being in contact.

3. Device according to claim 2, wherein the layer having a strong spin-orbit coupling is a layer made from a heavy material, a heavy material being a material whose atomic number is greater than or equal to 15.

4. Device according to claim 1, wherein the spin current application unit includes first terminals and the electric field application unit includes second terminals, the first terminals and the second terminals being combined.

5. Device according to claim 1, wherein the device includes a dielectric layer, the dielectric layer resting on a part of the input, the conversion unit resting on a part of the output, the ferroelectric layer being arranged to establish a contact between the dielectric layer and the conversion unit.

6. Device according to claim 1, wherein the conversion unit (16) and the ferroelectric layer are topped by a ferromagnetic layer.

7. Device according to claim 1, wherein the conversion unit is adapted to convert a spin current into a charge current according to a physical phenomenon, the physical phenomenon being an inverse Rashba-Edelstein effect or an inverse spin Hall effect.

8. Device according to claim 1, wherein the device is a transistor.

9. Digital port including at least one device according to claim 1.

10. Digital port according to claim 9, wherein the digital port is part of a storage unit.

11. Analog component comprising at least one device according to claim 1.

12. Analog component according to claim 11, wherein the component is part of a neural network.

13. Method for generating an output voltage by an electronic device, the device including an input and an output, the device generating an output voltage when the input of the device is supplied, the device comprising:
   a conversion unit,
   a spin current application unit,
   a layer made from a ferroelectric material, called ferroelectric layer having a ferroelectric polarization, the ferroelectric layer being arranged such that the ferroelectric polarization controls at least one among the amplitude and the sign of the charge current, and
   an electric field application unit,
the method comprising at least one step for:
   applying a spin current to the conversion unit, the step of applying a spin current being carried out by the spin current application unit,
   conversion by the spin current conversion unit applied to a charge current, the charge current having an amplitude and a sign, and
   applying an electric field to the ferroelectric layer, the step for applying an electric field being carried out by the electric field application unit.

14. Method according to claim 13, wherein the device is a transistor.

* * * * *